United States Patent
Ouellette et al.

(10) Patent No.: US 6,496,432 B2
(45) Date of Patent: Dec. 17, 2002

(54) METHOD AND APPARATUS FOR TESTING A WRITE FUNCTION OF A DUAL-PORT STATIC MEMORY CELL

(75) Inventors: Michael Richard Ouellette, Westford, VT (US); Jeremy Paul Rowland, South Burlington, VT (US); David Jerome Wager, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 09/733,295

(22) Filed: Dec. 8, 2000

(65) Prior Publication Data

US 2002/0110024 A1 Aug. 15, 2002

(51) Int. Cl.$^7$ .............................................. G11C 29/00
(52) U.S. Cl. .............. 365/201; 365/189.04; 365/230.05
(58) Field of Search ........................... 365/201, 189.04, 365/230.05, 189.06, 195; 371/21.1

(56) References Cited

U.S. PATENT DOCUMENTS

| | | |
|---|---|---|
| 4,817,051 A | 3/1989 | Chang |
| 5,579,322 A | 11/1996 | Onodera |
| 5,734,613 A | 3/1998 | Gibson |
| 5,742,557 A | 4/1998 | Gibbins et al. |
| 5,796,745 A | 8/1998 | Adams et al. |
| 5,825,782 A | 10/1998 | Roohparvar |
| 5,896,330 A | 4/1999 | Gibson |
| 5,973,985 A | 10/1999 | Ferrant |
| 5,987,632 A | 11/1999 | Irrinki et al. |
| 6,288,969 B1 * | 9/2001 | Gibbins et al. .............. 365/154 |

* cited by examiner

*Primary Examiner*—A. Zarabian
(74) *Attorney, Agent, or Firm*—Richard A. Henkler; Bracewell & Patterson, L.L.P.

(57) ABSTRACT

A method and apparatus for testing a write function of a dual-port static memory cell during a concurrent read/write cycle on a memory cell is disclosed. A memory cell of a dual-port static memory is read via a first port of the memory cell. After the read operation, the standard bitline restore operation that normally occurs after a read or write operation is suppressed from occurring on the bitlines for the first port. Then, the memory cell is read again via the first port at the same time the memory cell is being written via a second port with a logical data value that is opposite to the logical data value being read from the first port. After the completion of the write operation, the bitlines for the first and second ports are restored by a bitline restore operation. Finally, the logical data value in the memory cell is verified for its correctness.

8 Claims, 4 Drawing Sheets

METHOD AND APPARATUS FOR TESTING A WRITE FUNCTION OF A DUAL-PORT STATIC MEMORY CELL

BACKGROUND OF THE INVENTION

1. Technical Field

The present invention relates to a method and apparatus for testing in general, and in particular to a method and apparatus for testing memory cells. Still more particularly, the present invention relates to a method and apparatus for testing a write function of a dual-port static memory cell.

2. Description of the Prior Art

A dual-port memory cell typically consists of a static memory element and a set of access devices. In most applications, the static memory element is a pair of cross coupled inverters, and the access devices are N-channel transistors. Each port of the dual-port memory cell is associated with a pair of true and complement bitlines. The true side of the static memory element is connected to each true bitline via a respective access device, and the complement side of the static memory element is connected to each complement bitline via a respective access device. The bitlines carry data to or from the static memory element when the memory cell is being written or read.

All dual-port static memory cells are capable of having both a write cycle and a read cycle occurring simultaneously at separate ports of a same memory cell. Importantly, most, if not all, dual-port static memory cells are guaranteed by their manufacturers to have a successful data write operation during the above-mentioned concurrent read/write cycle at the same memory cell. The present disclosure provides a method and apparatus for testing a write function of a dual-port static memory cell during a concurrent read/write cycle on a memory cell.

SUMMARY OF THE INVENTION

In accordance with a preferred embodiment of the present invention, a memory cell of a multi-port memory is read via a first port of the memory cell. After the read operation, the standard bitline restore operation that normally occurs after a read or write operation is suppressed from occurring on the bitlines for the first port. Then, the memory cell is read again via the first port at the same time the memory cell is being written via a second port with a logical data value that is opposite to the logical data value being read from the first port. After the completion of the write operation, the bitlines for the first and second ports are restored by a bitline restore operation. Finally, the logical data value in the memory cell is verified for its correctness.

All objects, features, and advantages of the present invention will become apparent in the following detailed written description.

DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
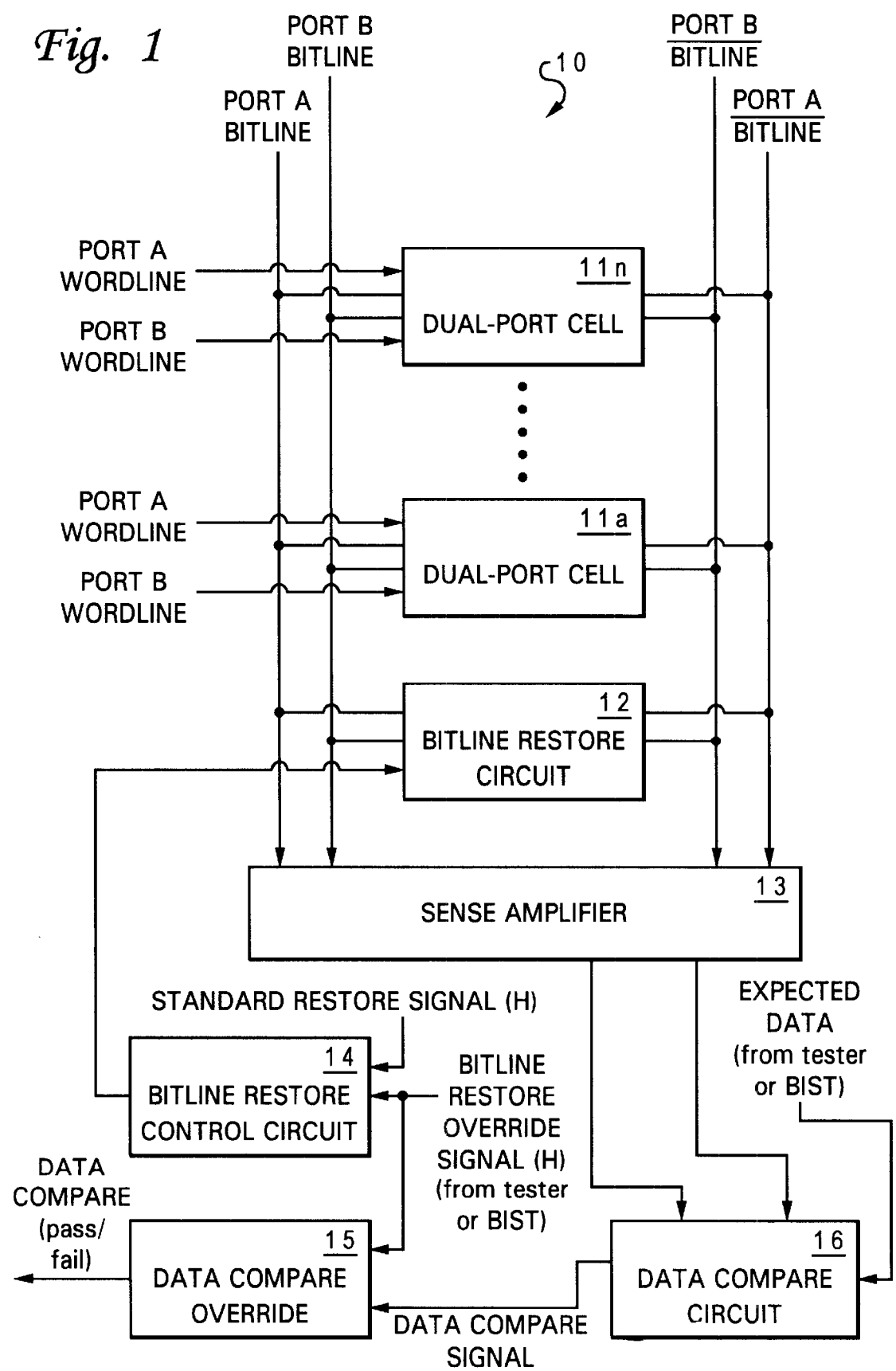
FIG. 1 is a block diagram of a dual-port memory having an apparatus for testing a write function, in accordance with a preferred embodiment of the present invention.

Referring now to the drawings and in particular to FIG. 1, there is depicted a block diagram of a dual-port memory having an apparatus for testing a write function, in accordance with a preferred embodiment of the present invention. As shown, a dual-port memory 10 includes several dual-port memory cells 11a–11n, a bitline restore circuit 12, and a sense amplifier 13. For testing the write function, dual-port memory 10 also includes a bitline restore control circuit 14, a data compare override circuit 15, and a data compare circuit 16. Bitline restore control circuit 14 is used to suppress the standard bitline restore operation normally occurring after each memory access. Data compare override circuit 15 is used to suppress the standard data compare operation normally occurring after each memory read access. Test data to be input to data compare circuit 16 for the testing of the read function of dual-port memory 10 can be originated from a tester external to dual-port memory 10 or from a built-in-self-test (BIST) located within dual-port memory 10.

Figure 2:
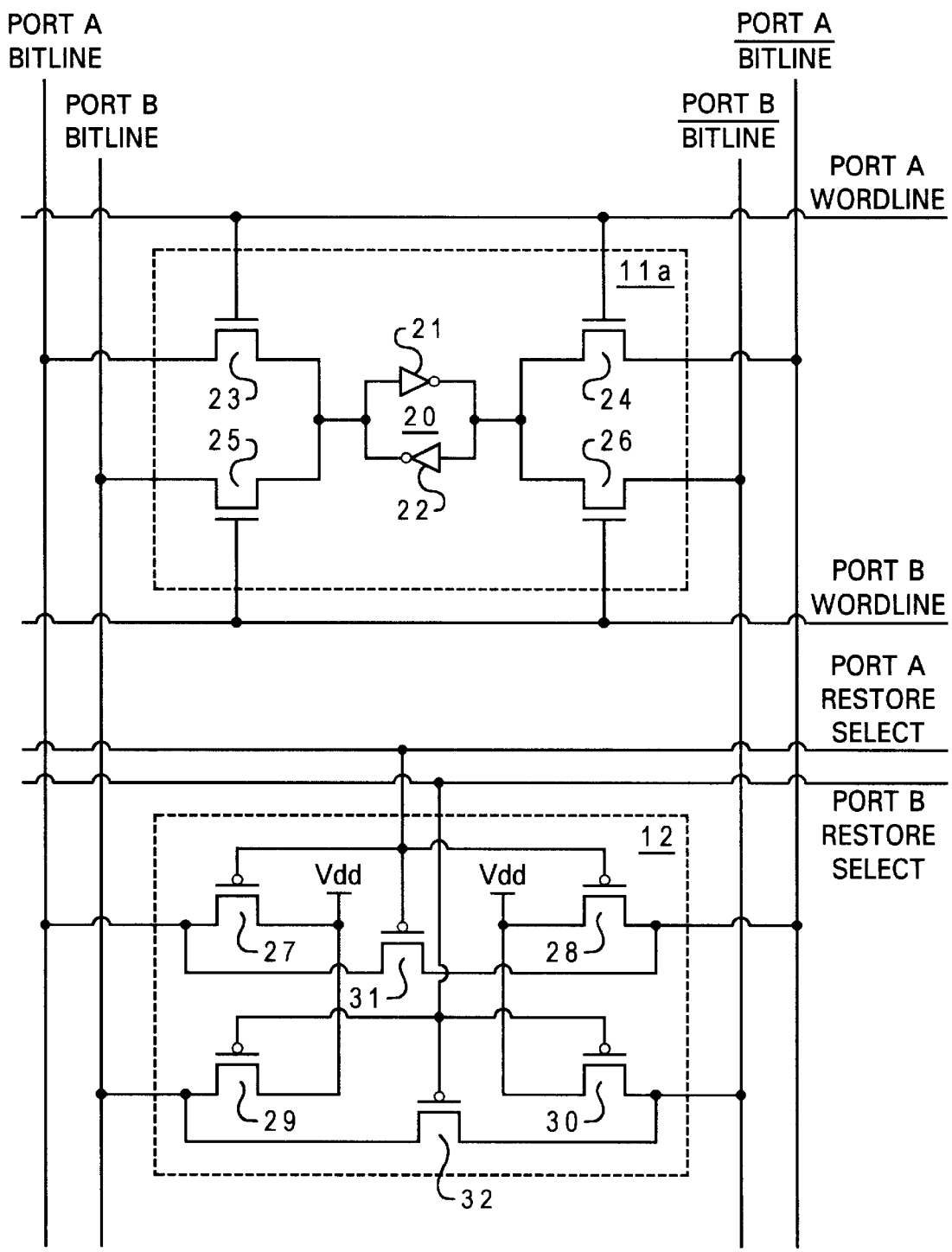
FIG. 2 is a circuit diagram of a bitline restore circuit along with a dual-port memory cell within the dual-port memory from FIG. 1, in accordance with a preferred embodiment of the present invention.

With reference now to FIG. 2, there is depicted a circuit diagram of bitline restore circuit 12 along with dual-port memory cell 11a, in accordance with a preferred embodiment of the present invention. As shown, memory cell 11a has a two-port storage element 20 that includes two inverters 21 and 22. The input and output of inverter 21 are connected to the output and input of inverter 22, respectively. The output of inverter 21 and the input of inverter 22 are connected to the drains of transistors 24, 26. The input of inverter 21 and the output of inverter 22 are connected to the drains of transistors 23, 25. The sources of transistors 23 and 24 are connected to port A's bitline and port A's $\overline{\text{bitline}}$, respectively. The sources of transistors 25 and 26 are connected to port B's bitline and port B's $\overline{\text{bitline}}$, respectively. The gates of transistors 23 and 24 are connected to port A's wordline. The gates of transistors 25 and 26 are connected to port B's wordline.

Bitline restore circuit 12 includes transistors 27–32. The drains of transistors 27–30 are connected a power supply $V_{DD}$. The sources of transistors 27 and 28 are connected to port A's bitline and port A's $\overline{\text{bitline}}$, respectively. The sources of transistors 29 and 30 are connected to port B's bitline and port B's $\overline{\text{bitline}}$, respectively. The gates of transistors 27 and 28 are connected to port A's bitline precharge/restore select. The gates of transistors 29 and 30 are connected to port B's bitline precharge/restore select. Transistor 31 straddles across port A's bitline and port A's $\overline{\text{bitline}}$, with its gate connected to port A's bitline precharge/restore select. Transistor 32 straddles across port B's bitline and port B's $\overline{\text{bitline}}$, with its gate connected to port B's bitline precharge/restore select.

Figure 3:
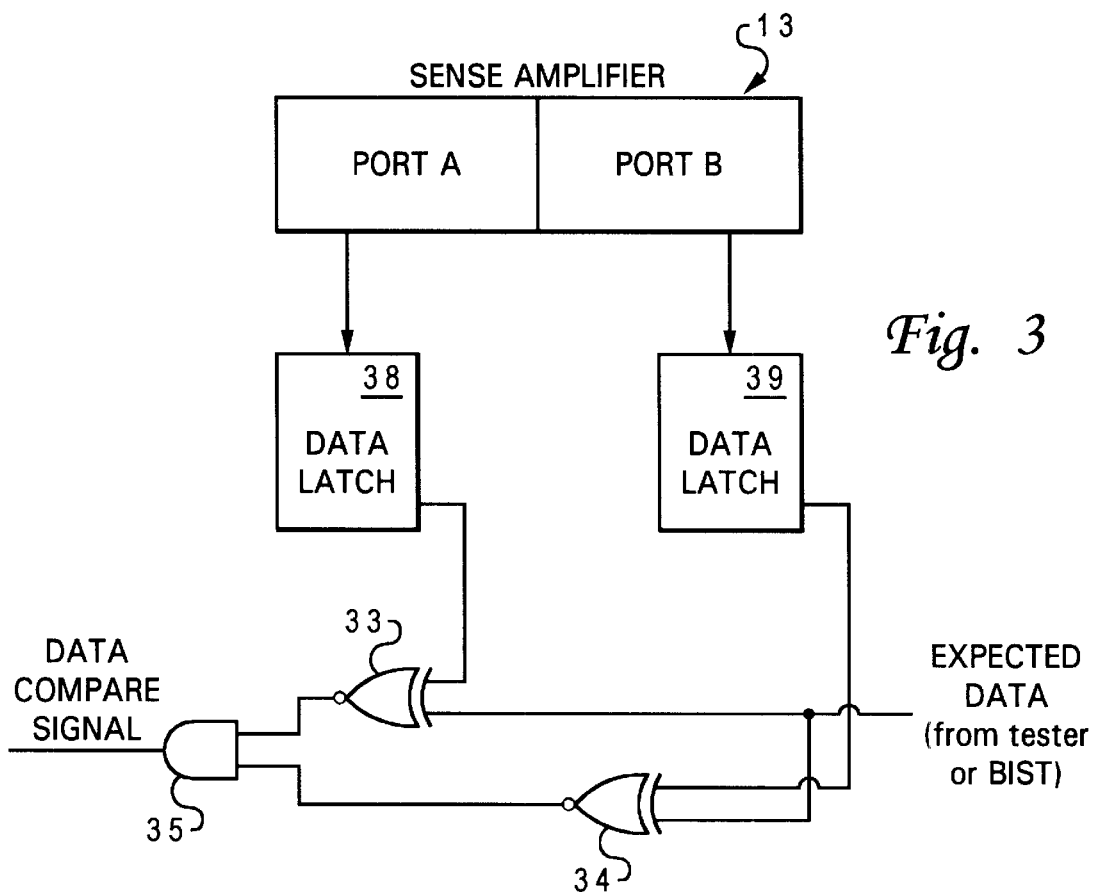
FIG. 3 is a circuit diagram of a data compare circuit within the dual-port memory from FIG. 1, in accordance with a preferred embodiment of the present invention.

Referring now to FIG. 3, there is depicted a circuit diagram of data compare circuit 16 in accordance with a preferred embodiment of the present invention. As shown, data compare circuit 16 includes a data latch 38 for receiving data from port A of sense amplifier 13, and a data latch 39 for receiving data from port B of sense amplifier 13. The outputs of data latches 38, 39 are connected to XNOR gates 33, 34, respectively. The outputs from XNOR gates. 33, 34 are then combined via an AND gate 35 to form a data compare signal.

Figure 4A:
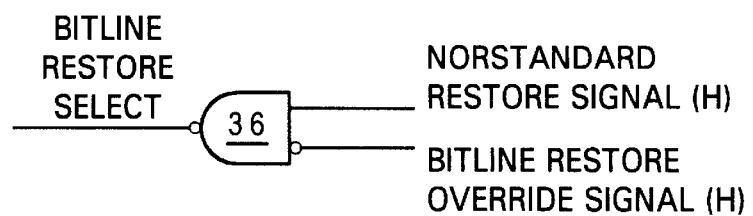
FIGS. 4a and 4b are circuit diagrams of a bitline restore control circuit and a data compare override circuit, respectively, within the dual-port memory from FIG. 1, in accordance with a preferred embodiment of the present invention.
Figure 4B:
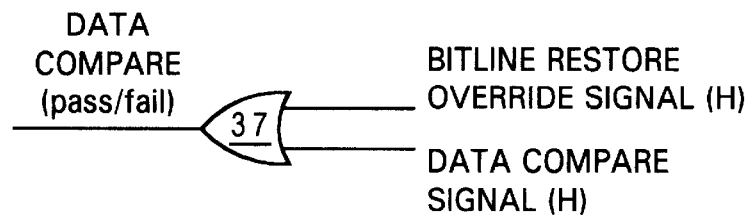

Bitline restore control circuit 14 and data compare override circuit 15, both from FIG. 1, can be separately implemented with an NAND gate 6 and an OR gate 37, as shown in FIGS. 4a and 4b, respectively. It is understood by those skilled in the art that many logic gate variations can be used to implement the functions of bitline restore control circuit 14 and data compare override circuit 15.

When performing a write operation to a dual-port memory cell such as memory cell 11a, the worst case scenario occurs when a differential voltage exists across the true and complement bitlines of one active port (for example, port A) and the memory element contain the same logical data as the voltage on this pair of bitlines while a data write operation for a logical data opposite to the logical data within the memory element is initiated from the other port (for example, port B). Because this is the worst situation which can occur during the operation of a memory cell, the functionality of the memory cell should be verified under the above-mentioned conditions or even worse conditions in order to guarantee a successful write operation under any other less strenuous operation conditions.

As a preferred embodiment of the invention, the above-mentioned condition can be produced by reading a memory cell during one cycle on a first port (which causes a differential voltage to develop) while preventing the standard restore operations from occurring afterwards, so that the bitlines can keep the differential voltage into the next cycle. During the next cycle, data of opposite logical value is written from a second port while also reading the memory cell through the first port (or either port if a read operation has been performed on both ports in the previous cycle).

Figure 5:
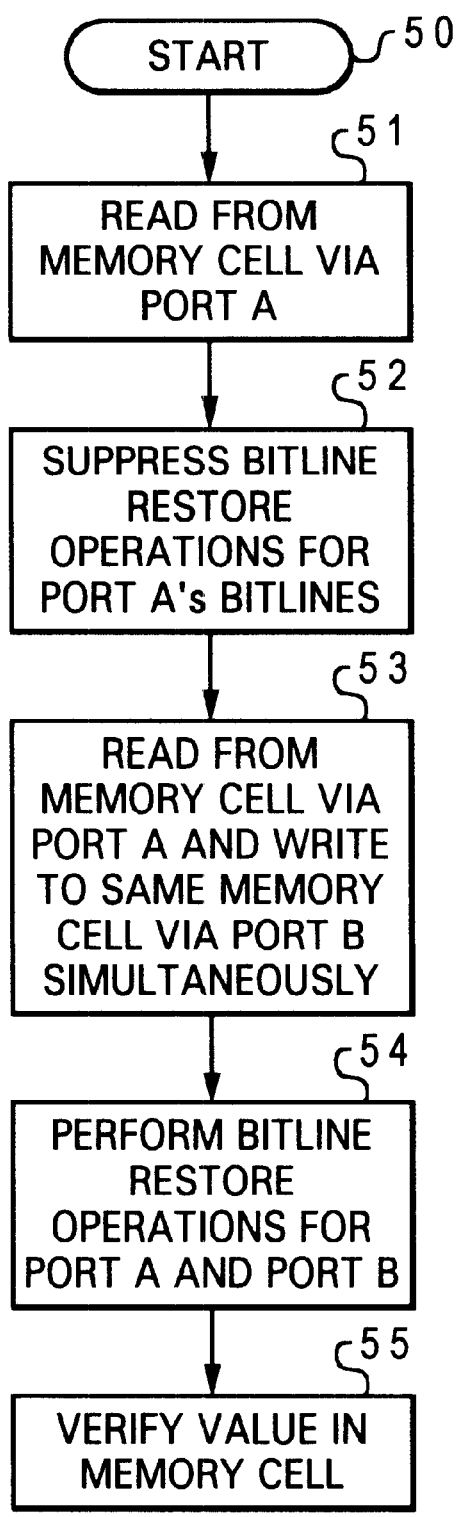
FIG. 5 is a high-level logic flow diagram of a method for testing a write function of a dual-port memory cell, in accordance with a preferred embodiment of the present invention.

Referring now to FIG. 5, there is depicted a high-level logic flow diagram of a method for testing a write function of a dual-port memory cell, in accordance with a preferred embodiment of the present invention. Starting in block 50, a memory cell is read via a first port (e.g., port A), as shown in block 51. After the read operation, the standard bitline restore operation that normally occurs after a read or write operation is not allowed to occur on the bitlines for the first port, as depicted in block 52. Then, the memory cell is read again via the first port at the same time the memory cell is being written via a second port (e.g., port B) with a logical data value that is opposite to the logical data value being read via the first port, as illustrated in block 53. For example, if the logical data value being read via port A is a logical "0," a logical "1" will be written via port B. After the completion of the write operation, the bitlines for the first and second ports can be restored by a bitline restore operation, as shown in block 54. Finally, the logical data value in the memory cell is verified for its correctness, as depicted in block 55.

As a preferred embodiment, an Ensure Write test is performed to establish the above-mentioned worst-case write condition for a dual-port memory cell through a combination of logic patterns generated either by an external memory tester or an on-chip BIST state machine and the necessary precharge select decoding circuits inside the memory circuits. During the Ensure Write test, a set of logic patterns of any valid size on a memory device can be supplied from the memory tester or the BIST state machine. The logic patterns are then sent across an interface bus, which provide all the test input signals to the memory device, including memory address, read/write control, clocks, and any other signals that are required to fully test the memory device, such as a pair of control signals which can override the normal function of either port's bitline precharge signal inside the memory device. The Ensure Write test preferably includes twelve sequential sweeps through the entire address space of the memory device, as depicted in Table I.

TABLE I

| Operation per cycle per address | Port A Read/Write State | Port B Read/Write State | Number of cycles |
| --- | --- | --- | --- |
| Sweep 1 | | | |
| 1. write "0" | n/a | write | NWORD |
| Sweep 2 | | | |
| 1. for port A only, read "0" with column restore clamped "off" following read optional disable compare) | read | write | NWORD * 3 |
| 2. read "0" to the same while writing "1" to port B with column restore active; disable compare | | | |
| 3. no operation to either port with column restore active | | | |
| Sweep 3 | | | |
| 1. read "1" | read | n/a | NWORD |
| Sweep 4 | | | |
| 1. write "1" | n/a | write | NWORD |
| Sweep 5 | | | |
| 1. read "1" with column restore clamped "off" following read (disable compare) | read | write | NWORD * 3 |
| 2. read "1" to the same while writing "0" to the other port with column restore active | | | |
| 3. no operation to either port with column restore active | | | |
| Sweep 6 | read | n/a | NWORD |
| 1. read "0" | | | |
| Sweep 7 | | | |
| 1. write "0" | write | n/a | NWORD |
| Sweep 8 | | | |
| 1. read "0" with column restore clamped "off" following read (disable compare) | write | read | NWORD * 3 |
| 2. read "0" to the same while writing "1" to the other port with column restore active | | | |
| 3. no operation to either port with | | | |

TABLE I-continued

| Operation per cycle per address | Port A Read/Write State | Port B Read/Write State | Number of cycles |
|---|---|---|---|
| column restore active | | | |
| Sweep 9 | | | |
| 1. read "1" | n/a | read | NWORD |
| Sweep 10 | | | |
| 1. write "1" | write | n/a | NWORD |
| Sweep 11 | | | |
| 1. read "1" with column restore clamped "off" following read (disable compare) | write | read | NWORD * 3 |
| 2. read "1" to the same while writing "0" to the other port with column restore active | | | |
| 3. no operation to either port with column restore active | | | |
| Sweep 12 | | | |
| 1. read 0 | n/a | read | NWORD |

NWORD is the number of words in the maximum size of the memory device. It is assumed that the memory device contains necessary circuits to shut down the memory array when the address is out of range for the memory device.

The purpose for each operation in the first three sweeps is as follows:

Sweep 1: The entire memory array is initialized to known data "0."

Sweep 2: The first access (read "0" with column restores disabled) generates a differential voltage across the bitlines for port A. The second access (read "0" while writing "1") further increases the differential voltage across the bitlines (which are connected through port A's access devices to the internal nodes of the memory cell) while the other port tries to write to the memory cell to an opposite state, generating a contention across the memory cell. The memory cell (including all write driver circuits) is designed to guarantee the success of the write operation; therefore, the second access should cause a logical "1" to be written to the memory cell. The third access (no operation) allows the bitlines to be fully restored before the next access.

Sweep 3: Reads the entire memory array to verify that the correct data was written.

The three-sweep pattern is repeated with opposite logic data (sweeps 4–6) and then all the ports are swapped, and all six previous sweeps are repeated (sweeps 7–9 and 10–12) for the opposite port.

The test pattern is implemented by treating the column address as the least significant address and the row address as the most significant address, but the test pattern could also be performed with equally valid results by treating the row address as the least significant address and the column address as the most significant address.

As has been described, the present invention provides a method and apparatus for testing a write function of a dual-port memory cell during a concurrent read/write cycle on a memory cell. Although a dual-port memory is used to illustrate the present invention, it is understood by those skilled in the art that the present invention is also applicable to any multi-port memory. Although a single concurrent read/write operation to a memory cell is used to illustrate the present invention, it is understood by those skilled in the art that the present invention is also applicable to a write operation during multiple read operations on the same memory cell.

While the invention has been particularly shown and described with reference to a preferred embodiment, it will be understood by those skilled in the art that various changes in form and detail may be made therein without departing from the spirit and scope of the invention.

What is claimed is:

1. A method for testing a write function of a multi-port memory, said method comprising:

reading a memory cell of a multi-port memory via a first port of said memory cell;

suppressing a restore operation from occurring on bitlines of said first port subsequent to said reading step;

reading said memory cell via said first port in concurrence with writing said memory cell via a second port;

performing a restore operation on bitlines of said first and second ports; and verifying the correctness of data in said memory cell.

2. The method of claim 1, wherein said writing step further includes a step of writing said memory cell with a logical value opposite from the logical value obtained from said reading step.

3. The method of claim 1, wherein said suppressing step is performed by a bitline restore control circuit.

4. The method of claim 1, wherein said verifying step is performed by a data compare circuit.

5. An apparatus for testing a write function of a multi-port memory, said apparatus comprising:

means for reading a memory cell of a multi-port memory via a first port of said memory cell;

means for suppressing a restore operation from occurring on bitlines of said first port subsequent to said reading step;

means for reading said memory cell via said first port in concurrence with writing said memory cell via a second port;

means for performing a restore operation on bitlines of said first and second ports; and means for verifying the correctness of data in said memory cell.

6. The apparatus of claim 5, wherein said writing means further includes a means for writing said memory cell with a logical value opposite from the logical value obtained from said reading means.

7. The apparatus of claim 5, wherein said suppressing means is a bitline restore control circuit.

8. The apparatus of claim 5, wherein said verifying means is a data compare circuit.

* * * * *